United States Patent
Muramatsu et al.

(10) Patent No.: US 6,667,767 B1
(45) Date of Patent: Dec. 23, 2003

(54) IMAGE SENSOR FOR OFFSETTING THRESHOLD VOLTAGE OF A TRANSISTOR IN A SOURCE FOLLOWER

(75) Inventors: Yoshinori Muramatsu, Tokyo (JP); Susumu Kurosawa, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 09/362,220

(22) Filed: Jul. 28, 1999

(30) Foreign Application Priority Data

Jul. 29, 1998  (JP) ............................... 10-214230

(51) Int. Cl.[7] .................... H04N 9/64; H04N 3/14; H01L 27/00
(52) U.S. Cl. .................... 348/243; 348/302; 348/241; 250/208.1
(58) Field of Search ................. 348/241, 243, 348/302, 307, 308, 310; 250/208.1

(56) References Cited

U.S. PATENT DOCUMENTS

| | | | |
|---|---|---|---|
| 5,162,912 A | * 11/1992 | Ueno et al. | 348/241 |
| 5,434,619 A | * 7/1995 | Yonemoto | 348/241 |
| 5,793,423 A | * 8/1998 | Hamasaki | 348/302 |
| 5,933,189 A | * 8/1999 | Nomura | 348/302 |
| 6,067,113 A | * 5/2000 | Hurwitz et al. | 348/241 |
| 6,118,115 A | * 9/2000 | Kozuka et al. | 250/208.1 |
| 6,163,023 A | * 12/2000 | Watanabe | 250/208.1 |
| 6,239,839 B1 | * 5/2001 | Matsunaga et al. | 348/308 |
| 6,483,541 B1 | * 11/2002 | Yonemoto et al. | 348/302 |
| 2001/0005227 A1 | * 6/2001 | Egawa et al. | 348/304 |

FOREIGN PATENT DOCUMENTS

JP          04241586 A  *  8/1992 ......... H04N/5/335

* cited by examiner

Primary Examiner—Wendy R. Garber
Assistant Examiner—John M. Villecco
(74) Attorney, Agent, or Firm—McGinn & Gibb, PLLC

(57) ABSTRACT

There is disclosed an image sensor wherein the dispersion in threshold voltages of a transistor constituting a source follower for outputting a signal is compensated. The disclosed image sensor is provided with a coupling capacitor to which an output voltage of a pixel is applied through a transistor and with a transistor of a source follower to read out a voltage at the node S/Hn of the coupling capacitor. The image sensor is so configured that a drain of a transistor is used as a power supply voltage and the transistor is turned on, causing a node S/Hn pre-charged to the power supply voltage, and then the transistor is turned on, causing the voltage of the node S/Hn to be clamped on a sum of a definite voltage and a threshold voltage of the transistor, and further the transistor is turned on, causing an output voltage generated when a pixel is exposed to light to be added to the capacitor, and by restoring the transistor to a power supply voltage of the drain and by again turning the transistor on, an output voltage generated when a pixel is unexposed to light is applied to the capacitor.

12 Claims, 7 Drawing Sheets

US 6,667,767 B1

IMAGE SENSOR FOR OFFSETTING THRESHOLD VOLTAGE OF A TRANSISTOR IN A SOURCE FOLLOWER

BACKGROUND OF THE INVENTION

1. Field of the Invention

The present invention relates to an image sensor and more particularly to a MOS (Metal Oxide Semiconductor) type image sensor in which the dispersion in a threshold voltage of a transistor constituting a source follower to output a photoelectric conversion voltage of a pixel to the outside is compensated.

2. Description of the Related Art

An image sensor is a sensor to convert optical image information to an electrical signal in a TV camera and the like. A MOS-type image sensor in particular is so configured as to have a photodiode as a photoelectric conversion device and its peripheral devices composed of a MOS-type FET (Field Effect Transistor), which is featured by low power consumption, low costs, etc.

FIG. 5 is a block diagram illustrating configurations of a conventional MOS-type image sensor. Configurations and operations of the MOS-type image sensor are hereafter described referring to FIG. 5.

As depicted in FIG. 5, a conventional MOS-type image sensor is composed of a pixel array 31 in which many unit pixels (i.e., picture elements) 30 are arrayed in a matrix-like manner in horizontal (low) and vertical (column) directions, an address decoder 32, a vertical shift register 33, a vertical driver 34, a clock control circuit 35, a noise control circuit 36 and a horizontal shift register 37.

The unit pixel 30 consists of a photodiode 301 being a photoelectric conversion device, a transistor 302 to reset the photodiode to a power supply voltage Vcc, a transistor to amplify a photoelectric conversion voltage of the photodiode 301 and a read-out transistor to connect a transistor 303 for amplification to a bit line BL corresponding with activation of a word line WL.

An address signal read out from a control circuit not shown is divided, via the address decoder 32, into two signals, one going in the vertical direction and the other in the horizontal direction. The vertical shift register 33, when receiving the address signal in the vertical direction, generates a read-out control signal which is shifted sequentially in the vertical direction. The control signal is sequentially fed to each word line WL so that a pixel in the pixel array 31 for each word line can be read out. On the other hand, the horizontal shift register 37, when receiving the address signal in the horizontal direction, selects sequentially the bit line BL to connect it to the noise control circuit 36 and reads out the photoelectric conversion voltage of the photodiode 301 for every unit pixel at a cross point of the word line WL and the bit line BL and then, after noise control, generates an image signal output. At this point, the noise control circuit 36 is adapted to remove noises caused by switching operations of each gate transistors which are produced in a manner overlapping the photoelectric conversion output fed from the photodiode 301.

There are conventionally a variety of types of circuits for reading outputs and removing noises in such a MOS-type image sensor.

FIG. 6 is a block diagram illustrating a conventional image sensor and FIG. 7 is a timing chart showing operations of the circuit shown in FIG. 7.

As shown in FIG. 6, the conventional image sensor is composed of unit pixels 41 and 42 located on an arbitrary n-th (n=0,1,2 . . . ) line and in a n-th+1st string being neighboring to an arbitrary n-th string in a pixel array constituting the image sensor, noise control circuits 43 and 44 on the n-th string and n-th+1st string respectively, a current source 45 constituting a source follower together with transistors 203 of the noise control circuit 43 and the like, a P channel transistor 46 constituting the source follower, a current source 47 and a P channel transistor 48. The number of lines and strings constituting the pixel array is configured arbitrarily.

The pixel 41 consists of a photodiode 101 being a photoelectric conversion device, N channel transistors 102, 103 and 104, and a current source 105.

The photodiode 101 is adapted to convert incident light at the unit pixel to an electrical signal. The transistor 102 resets an initial voltage of the photodiode 101 to a power supply voltage Vcc in accordance with a reset control signal RSTn on the n-th line. The transistor 103 constitutes a source follower to amplify the photoelectric conversion voltage of the photodiode 101 together with the current source 105. The transistor 104 serves to connect the transistor 103 through a data output line DATAn on the n-th string to the current source 105 in accordance with a word line read-out control signal WLn on the n-th line. The current source 105 feeds a constant current to the transistor 103 connected through a gate composed of a transistor 104. Configurations and functions of a pixel 42 are the same as the pixel 41.

The noise control circuit 43 is composed of N channel transistors 201, 203 and 204, a coupling capacitor 202 and a P channel transistor 205.

The transistor 201 connects the data output line DATAn to the coupling capacitor 202 in accordance with a signal voltage read-out control signal SHS. The coupling capacitor acts to transmit a change of an output voltage of the data output line DATAn to a node S/Hn. The transistor 203 constitutes a source follower together with the current source 45 and outputs a voltage of the node S/Hn to a transistor 46. The transistor 204 connects the transistor 203 to the current source 45 in accordance with a bit line read-out control signal YSWn. The transistor 205 connects the node S/Hn to a power supply source OCVn in accordance with a clamp control signal OCI. Configurations and functions of a noise control circuit 44 and other noise control circuits not shown are the same as the noise control circuit 43.

A current source 45 feeds a constant current to the transistors 203 and the like. The transistor 46 constitutes a source follower together with a current source 47 and outputs an output voltage Vout in accordance with a voltage of a gate. The transistor 48 connects the transistor 46 to the current source 47 in accordance with an output enable signal OE.

Operations of the conventional image sensor shown in FIG. 6 are described by referring to FIG. 7. Operations of the pixel 41 and the noise control circuit 43 are described primarily, however, operations of the pixel 42 and other pixels not shown and of the noise control circuit 44 and other noise control circuits not shown are the same as above. By making LOW a vertical read-out control signal IRASB, a vertical address of the pixel array is sequentially designated. Moreover, by making HIGH a signal voltage read-out control signal SHS, a gate composed of the transistor 201 is turned ON, causing the data output line DATAn to be connected to the coupling capacitor 202. Then, in accordance with the designated address, the word line read-out control signal WLn is made HIGH and a clamp control signal OCI is made LOW.

When a reset control signal RSTn is made HIGH by a previous resetting operation and the gate composed of the transistor 102 is turned ON, if the photodiode 101 is exposed to light for a definite time while it is charged to the power supply voltage Vcc, its voltage drops responsive to an incident light level. At this point, since the word read-out control signal WLN is made HIGH, a gate composed of the transistor 104 is turned ON, causing a photoelectric conversion voltage generated when the photodiode is exposed to light to be outputted to the data output line DATAn through a source follower composed of the transistor 103.

In this state, because the signal voltage read-out control signal SHS is made HIGH and a gate composed of the transistor 201 is turned ON, a voltage of the data output line DATAn is applied to the coupling capacitor 202. At this point, since the clamping control signal OCI is made LOW, a gate composed of the transistor 205 is turned ON and, at the same time, because the voltage of the power supply OCVn has been dropped to a voltage V1, the node S/Hn is clamped on the voltage V1, and then a voltage of the data output line DATAn is read out by the coupling capacitor 202.

Furthermore, by making LOW the signal voltage read-out control signal SHS and turning ON a gate composed of the transistor 201 temporarily, and by making HIGH a clamping control signal OCI, a gate composed of the transistor 205 is turned OFF, causing the voltage of the power supply OCVn to be restored to the power supply voltage Vcc.

Then, by making HIGH a reset control signal RSTn, a gate composed of the transistor 102 is turned ON, causing the photodiode 101 to be charged to the power supply voltage Vcc. Then, after the reset control signal RSTn is turned ON and a gate composed of the transistor 102 is turned OFF, by again making HIGH the voltage read-out control signal SHS and by turning ON the gate composed of the transistor 201, a photoelectric conversion voltage generated when the photodiode is unexposed to light is applied to the coupling capacitor. By this, an output represented by the following formula (1) is read out at the node S/Hn through the coupling capacitor 202:

$$V1+\text{(photoelectric voltage generated at unexposed time)}-\text{(photoelectric voltage generated at exposed time)} \quad (1)$$

At this point, by making HIGH the bit line read-out control signal YSWn, a gate composed of the transistor 204 is turned ON, and a voltage of the node S/Hn is outputted at the gate of the transistor 46 through a source follower composed of the transistor 203. In this state, because the output enable signal OE goes LOW, a gate composed of the transistor 48 is turned ON, causing an output voltage Vout to be outputted through a source follower composed of the transistor 46.

Because the output voltage Vout corresponds with the remainder of the photoelectric voltage generated at the unexposed time and that generated at the exposed time as shown in the above formula (1), in the external circuits now shown, by this output voltage Vout, signal voltages from which a noise caused by switching operations of each transistor constituting the gate of the pixel 41 and the noise control circuit 43 has been removed or in which the dispersion in threshold values of the transistor 103 constituting the source follower of the pixel 11 has been offset and removed can be obtained.

However, in the above conventional image sensor, even if subtraction between the photoelectric conversion voltage generated when the pixel is unexposed to light and that generated when exposed to light is performed, the dispersion in threshold voltages of the transistor 203 constituting the source follower for coupling outputs, for example, in the noise control circuit 43 cannot be offset and removed, presenting a problem in that the output signal Vout is affected by the dispersion in threshold voltages of the transistor 202.

SUMMARY OF THE INVENTION

In view of the above, it is an object of the present invention to provide an image sensor wherein an output voltage of each column is not affected by the dispersion in a threshold voltage of a transistor constituting a source follower to output a signal output of each column to the outside.

According to a first aspect of the present invention, there is provided an image sensor comprising:

a coupling capacitor to which a photoelectric conversion voltage generated when a pixel is exposed to light and a photoelectric conversion voltage generated when said pixel is unexposed to light are sequentially applied; and a source follower through which an output, generated at a node on the output side of said coupling capacitor, being the remainder of the photoelectric conversion voltage generated when the pixel is unexposed to light and that generated when the pixel is exposed to light is taken;

whereby the node on the output side of the capacitor is clamped on a sum of a definite voltage and a threshold voltage of a transistor constituting the source follower and, after the photoelectric conversion voltage generated when the pixel is exposed to light has been read out, the photoelectric conversion voltage generated when the pixel is unexposed to light is read out.

According to a second aspect of the present invention, there is provided an image sensor comprising:

a coupling capacitor to which a photoelectric conversion voltage generated when a pixel is exposed to light and that generated when the pixel is unexposed to light are sequentially applied; and a source follower through which an output, generated at a node on the output side of the coupling capacitor, being the remainder of the photoelectric conversion voltage generated when the pixel is unexposed to light and that generated when exposed to light is taken;

whereby a drain of a transistor constituting the source follower, when the photoelectric conversion voltage generated when the pixel is exposed to light is read out, is clamped on a definite voltage, and a gate and a source of the above transistor is connected via gate means and, when the photoelectric conversion voltage generated when the pixel is unexposed to light is read out, the gate means is turned off and simultaneously the clamping of the drain is released.

According to a third aspect of the present invention, there is provided an image sensor comprising:

a coupling capacitor connected to a data output line for every column through a first gate means which is turned on when a signal voltage of the data output line is read out; and a source follower used to read out a voltage at a node on the output side of the coupling capacitor;

whereby a second gate connected between a drain of a transistor constituting the source follower and the node is turned on, causing the above node to be pre-charged to a power supply voltage and then a third gate means connected between a gate of the transistor and a source is turned on and, with a voltage of a drain of the transistor dropped to a definite level, the first gate means is turned on, causing an output voltage of the data output line generated when the pixel is exposed to light to be applied to the coupling capacitor and, then, with the voltage of a drain of the transistor restored to a power supply voltage, the first gate means is again turned on, causing the output voltage of the data output line generated when the pixel is unexposed to light to be applied to the coupling capacitor.

In the foregoing, a preferable mode is one wherein the pixel is provided with a photodiode with its cathode grounded and with its anode reset to a predetermined voltage at the time of a start of operations, and with a source follower used to output a voltage of the anode of the photodiode to the data output line when data is read out.

According to a fourth aspect of the present invention, there is provided an image sensor comprising:

a coupling capacitor to which a photoelectric conversion voltage generated when a pixel is exposed to light and that generated when the pixel is unexposed to light are sequentially applied; and a source follower through which an output, generated at a node on the output side of the coupling capacitor, being the remainder of the photoelectric conversion voltage generated when the pixel is unexposed to light and that generated when is exposed to light is taken;

whereby a node on the output side of the coupling capacitor is clamped on a sum of a definite voltage and a threshold voltage of the transistor constituting the source follower and, after the photoelectric conversion voltage generated when the pixel is unexposed to light has been read out, the photoelectric conversion voltage generated when the pixel is exposed to light is read out.

According to a fifth aspect of the present invention, there is provided an image sensor comprising:

a coupling capacitor to which a photoelectric conversion voltage generated when a pixel is exposed to light and that generated when the pixel is unexposed to light are sequentially applied; and a source follower through which an output, generated at a node on the output side of the coupling capacitor, being the remainder of the photoelectric conversion voltage generated when the pixel is unexposed to light and that generated when the pixel is exposed to light is taken;

whereby, at the time when the photoelectric conversion voltage generated when the pixel is unexposed to light is read out, with the photodiode isolated from the pixel, the voltage of a drain of the transistor constituting the source follower is dropped to a definite level and, at the same time, a gate and a source of the transistor are connected via a gate means, and at the time when the photoelectric conversion voltage generated when the pixel is exposed to light is read out, the photodiode is connected to the pixel and the gate means is turned off and simultaneously the voltage of the drain is restored to its original level.

According to a sixth aspect of the present invention, there is provided an image sensor comprising:

a coupling capacitor connected to a data output line for every column through a first gate means which is turned on when a signal voltage of said data output line is read out; and a source follower used to read out a voltage at a node on the output side of the coupling capacitor;

whereby, with a photodiode isolated from a pixel, a second gate between a gate and a source of a transistor constituting the source follower and, at the same time, with a drain of the transistor dropped to a definite voltage, the first gate means is turned on, causing an output voltage of a data output line in the pixel to be applied to the coupling capacitor, and then the photodiode is connected to the pixel and, with the voltage of the drain of the transistor restored to a power supply voltage, the first gate means is turned on, causing the output voltage in the data output line generated when the pixel is exposed to light to be applied to the coupling capacitor.

In the foregoing, a preferable mode is one wherein the pixel is provided with a photodiode with its cathode grounded and with its anode reset to a definite voltage at the time of a start of operations, a source follower used to output the voltage of the anode of said photodiode to the data output line when data is read out and a fourth gate means used to isolate the photodiode from aid pixel.

BRIEF DESCRIPTION OF THE DRAWING

The above and other objects, advantages and features of the resent invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
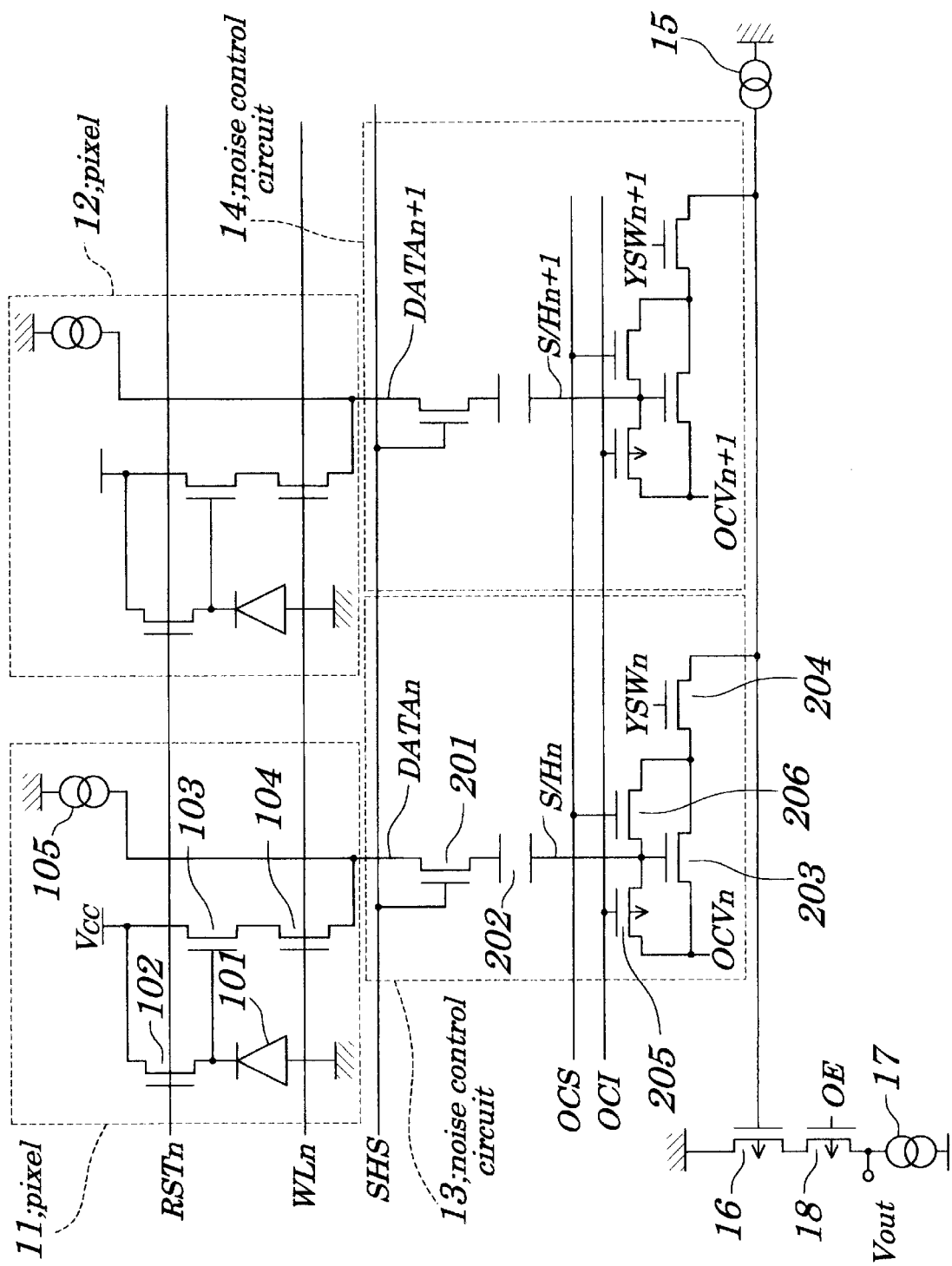
FIG. 1 is a block diagram showing electric configurations of an image sensor according to a first embodiment of the present invention.
Figure 2:
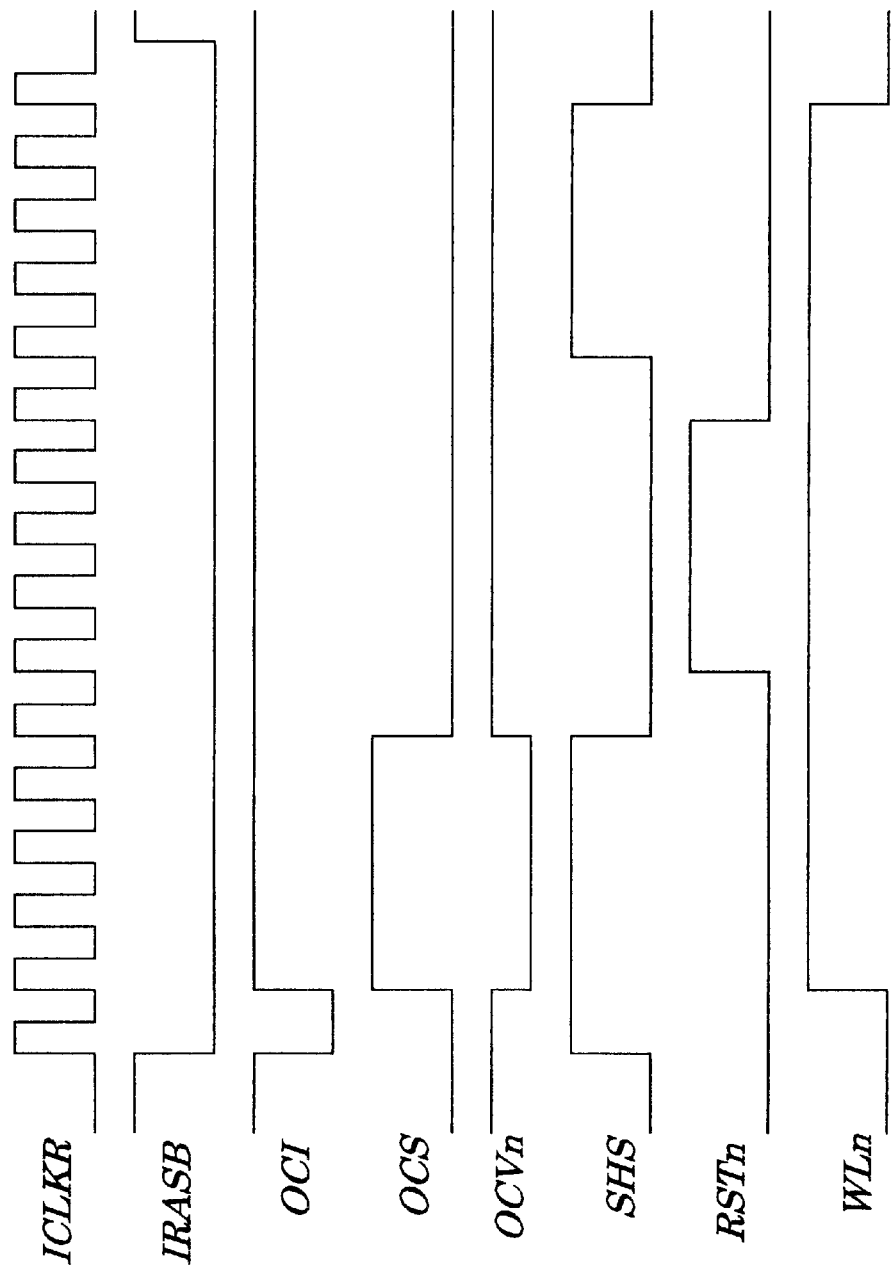
FIG. 2 is a timing chart explaining operations of the image sensor shown in FIG. 1.

FIG. 1 is a block diagram illustrating electrical configurations of an image sensor according to a first embodiment of the present invention. FIG. 2 is a timing chart showing operations of the image sensor shown in FIG. 1.

Referring to FIG. 1, the image sensor is composed of unit pixels 11 and 12 located on an arbitrary n-th (n=0,1,2 . . . ) line and in a n-th+1st string being neighboring to an arbitrary n-th string in a pixel array constituting the image sensor, noise control circuits 13 and 14 on the n-th string and n-th+1st string respectively, a current source 15 constituting a source follower together with transistors 203 of the noise control circuit 13 and the like, a P channel transistor 16 constituting the source follower, a current source 17 and a P channel transistor 18. The number of lines and strings constituting the pixel array is configured arbitrarily. The pixel 11 consists of a photodiode 101 being a photoelectric converter, N channel transistors 102, 103 and 104 and a current source 105, which has the same configuration as a pixel 41 shown in FIG. 6. The pixel 12 and other pixels not shown have the same configurations and functions as the pixel 11.

The noise control circuit 13 is composed of N channel transistors 201, 203, 204 and 206, a coupling capacitor 202 and a P channel transistor 205. Its configurations and functions except those of the transistor 206 are the same as a noise control circuit 43 shown in FIG. 6. When a voltage of a data output line DATAn is applied to the coupling capacitor 202, the transistor 206 is adapted to clamp a voltage of a node S/Hn on a sum of a voltage V1 of a power supply OCVn and a threshold voltage Vt of the transistor 203. Configurations and functions of the noise control circuit 14 and other noise control circuits not shown are the same as the noise control circuit 13.

Figure 6:
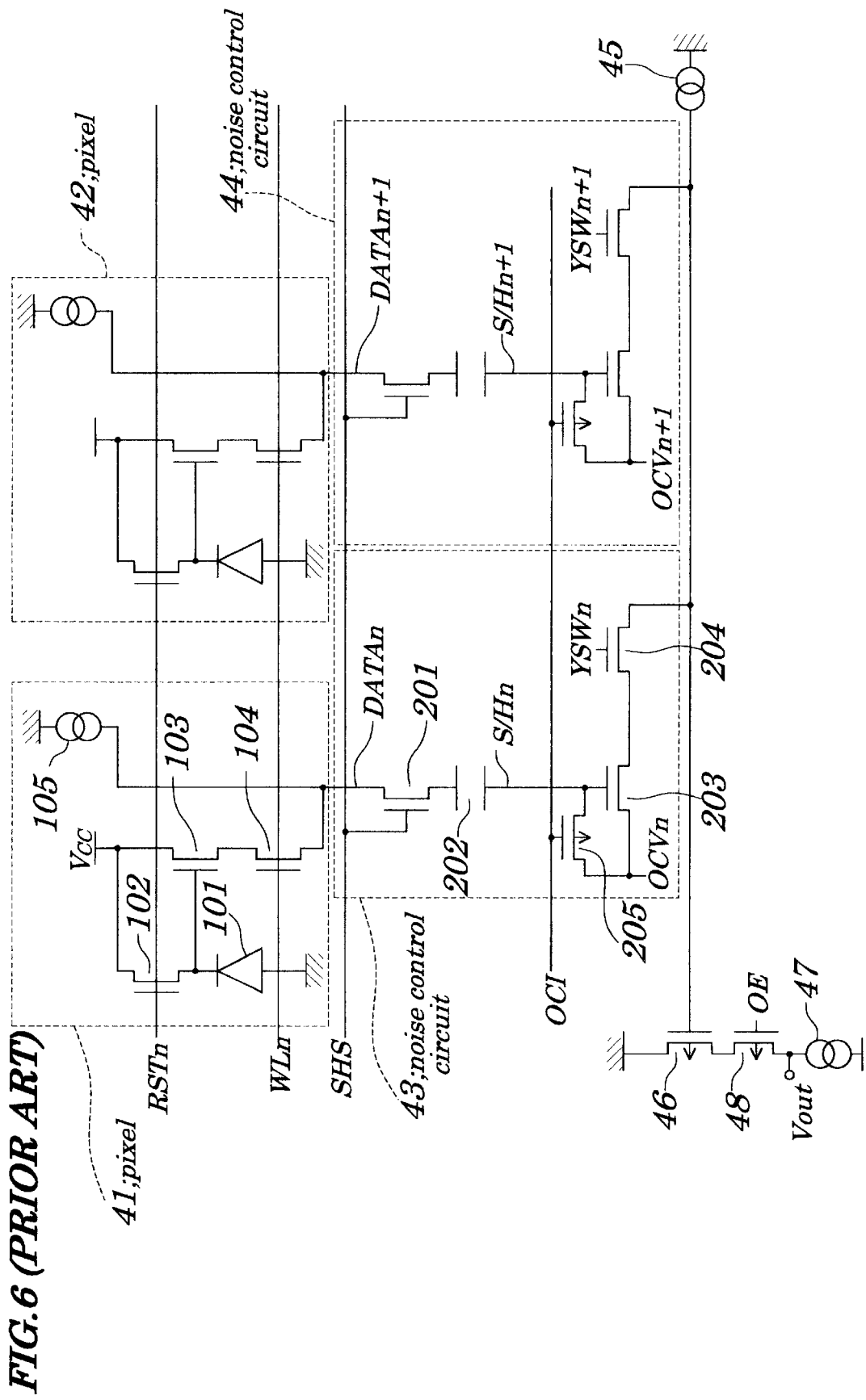
FIG. 6 is a block diagram of a conventional image sensor.
Figure 7:
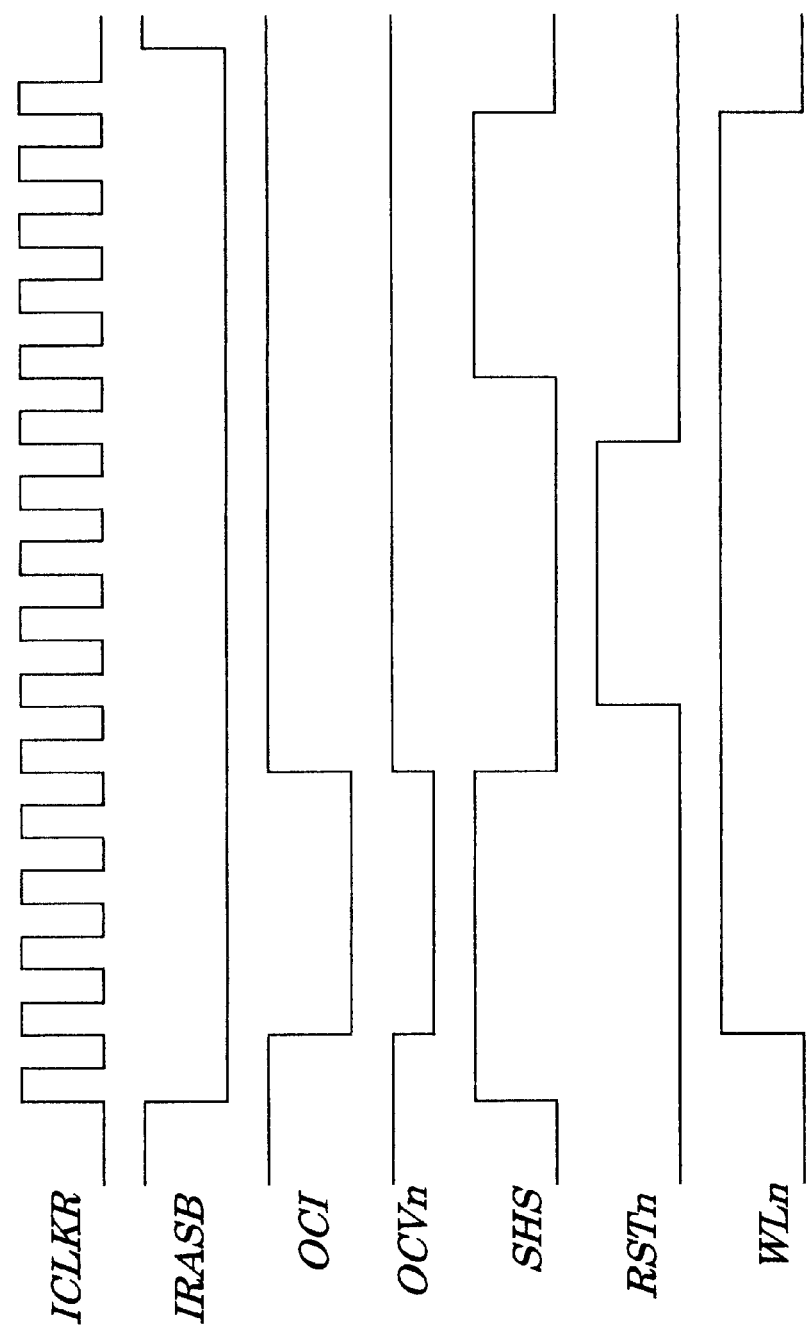
FIG. 7 is a timing chart showing operations of the conventional image sensor shown in FIG. 6.

Moreover, configurations and functions of the current sources 15 and 17 and of the transistors 16 and 18 are the same as current sources 45 and 47 and transistors 46 and 48 shown in FIG. 6.

Operations of the image sensor as configured above are described hereafter referring to FIG. 2. Operations of the pixel 11 and the noise control circuit 13 are mainly described, however, the principles of operations of the pixel 12, other pixels not shown, the noise control circuit 14 and other noise control circuits not shown are the same as the pixel 11 and the noise control circuit 13 described here.

By making LOW a vertical read-out control signal, a vertical address of a pixel array is sequentially designated. By making HIGH a signal voltage read-out control signal, a gate composed of the transistor 201 is turned ON, causing the data output line DATAn to be connected to the coupling capacitor 202. Furthermore, by making LOW a clamping control signal OCI, a gate composed of the transistor 205 is turned ON, causing the node S/Hn on the output side of the coupling capacitor to be pre-charged to a power source voltage Vcc by the power source OCVn.

When a reset control signal RSTn is made HIGH by a previous resetting operation and the gate composed of the transistor 102 is turned ON, if the photodiode 101 is exposed to light for a definite time while it is charged to the power supply voltage Vcc, its voltage drops responsive to an incident light level.

In this state, by making HIGH the clamping control signal OCI and by turning OFF the gate composed of the transistor 205, the node S/Hn is isolated from the power source OCVn, and further by making HIGH a word line read-out control signal WLn in accordance with the vertical address designated, a gate composed of the transistor 104 is turned ON, causing a photoelectric conversion voltage at the time of the exposure to light of the photodiode 101 to be fed to the data output line DATAn through the source follower consisting of the transistor 103 and the current source 105.

At this point, by simultaneously making HIGH a threshold read-out control signal OCS, a gate composed of the transistor 206 is turned ON and, at the same time, the voltage of the power supply OCVn is dropped to a voltage V1, causing the voltage of the node S/Hn to be clamped on a voltage V1 +Vt (Vt being a threshold voltage of the transistor 203), and in this state the voltage of the data output line DATAn is read out by the coupling capacitor 202.

Then, by making LOW the signal voltage read-out control signal SHS to isolate the coupling capacitor 202 from the data output line DATAn and by making LOW the threshold read-out control signal OCS to turn OFF the transistor 206 and to restore the power supply OCVn to its power supply voltage Vcc, and further making HIGH the reset control signal RSTn to turn ON the gate composed of the transistor 102, the photodiode 101 is charged to the power supply voltage Vcc. After the reset control signal RSTn is turned OFF, by again making HIGH the voltage read-out control signal SHS, the gate composed of the transistor 201 is turned ON and, in an unexposed state, if a photoelectric conversion voltage of the photodiode 101 is applied to the coupling capacitor 202, a voltage represented by the following formula (2) is read out by the node S/Hn through the coupling capacitor 202:

$$V1 + Vt + \text{(photoelectric voltage generated at unexposed time)} - \text{(photoelectric voltage generated at exposed time)} \quad (2)$$

At this point, by making HIGH a bit line read-out control signal YSWn, the gate composed of the transistor 204 is turned ON and, accordingly, a voltage of the node S/Hn is outputted to a gate of the transistor through the source follower consisting of the transistor 203 and the current source 15. In this state, by making LOW an output enable signal OE, a gate composed of the transistor 16 is turned ON and an output voltage Vout is generated through a source follower consisting of the transistor 16 and the current source 17.

Because the output voltage Vout corresponds with the remainder of the photoelectric voltage generated at the unexposed time and that generated at the exposed time as shown in the above formula (2), in the external circuits now shown, by this output voltage Vout, signal voltages from which a noise caused by switching operations of each transistor constituting gates of the pixel 11 and the noise control circuit 13 has been removed or in which the dispersion in threshold values of the transistor 103 constituting the source follower of the pixel 11 has been offset and removed can be obtained, and further because, to the voltage of the node S/Hn, a threshold voltage Vt of the transistor 203 constituting a source follower for outputting signals for every column is added, the dispersion in the threshold values of this transistor is offset and removed, changes in operational characteristics can be compensated accordingly.

In the image sensor according to this embodiment, output voltages in which threshold voltages of the transistor constituting a source follower for outputting signals for every column have been offset can thus be obtained, thereby allowing supply of signal voltages of a pixel in which changes in operational characteristics caused by the dispersion in the threshold voltages have been compensated.

Second Embodiment

Figure 3:
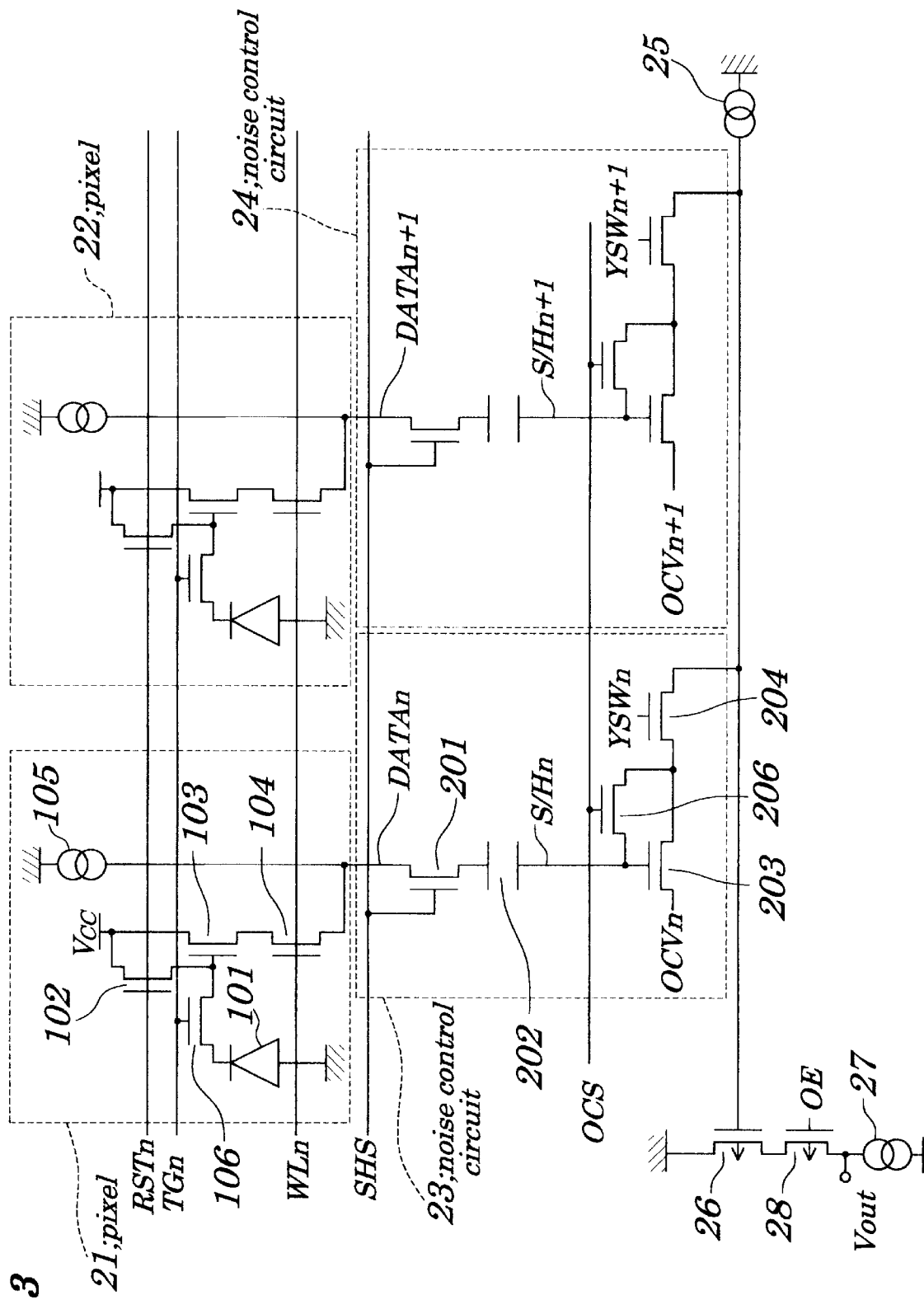
FIG. 3 is a block diagram showing electrical configurations of an image sensor according to a second embodiment of the present invention.
Figure 4:
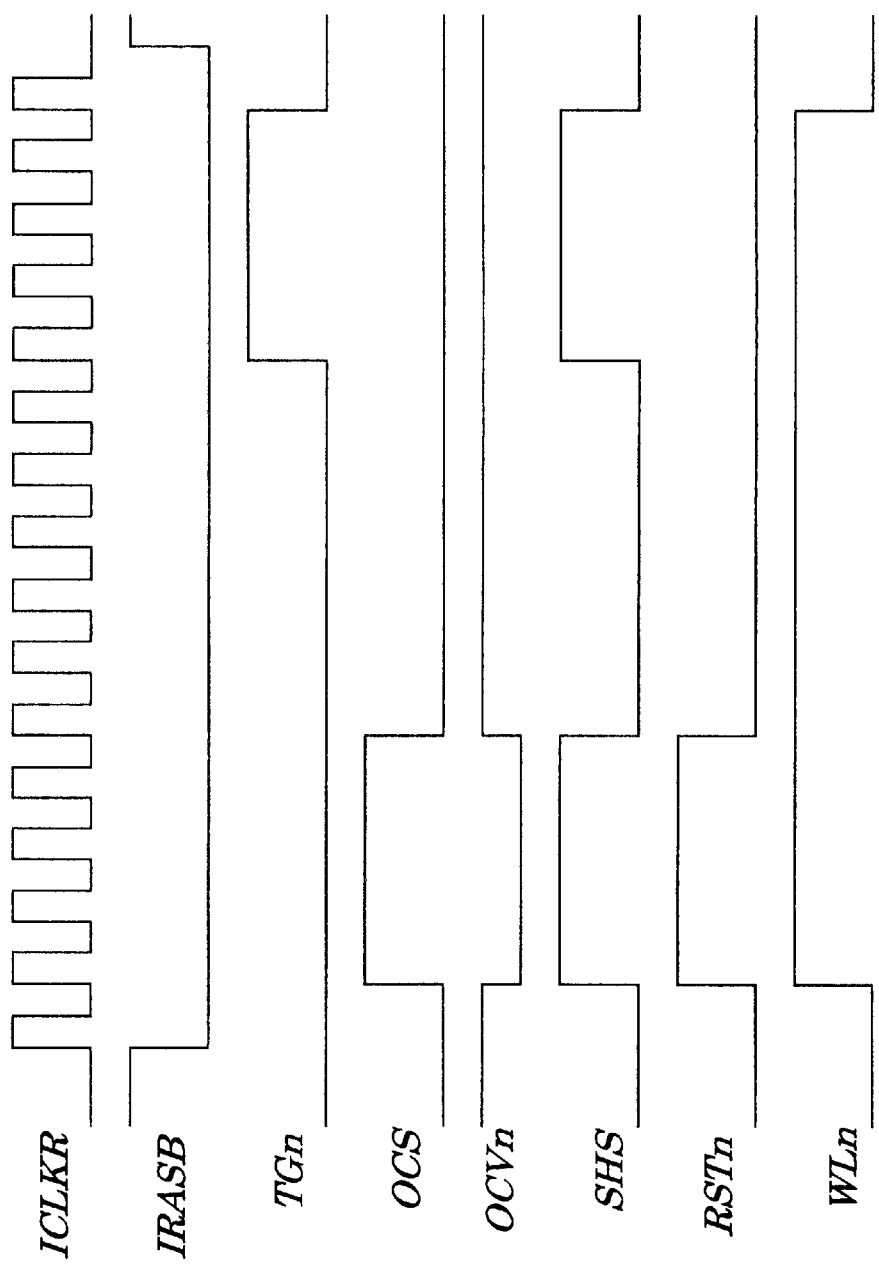
FIG. 4 is a timing chart explaining operations of the image sensor shown in FIG. 2.
Figure 5:
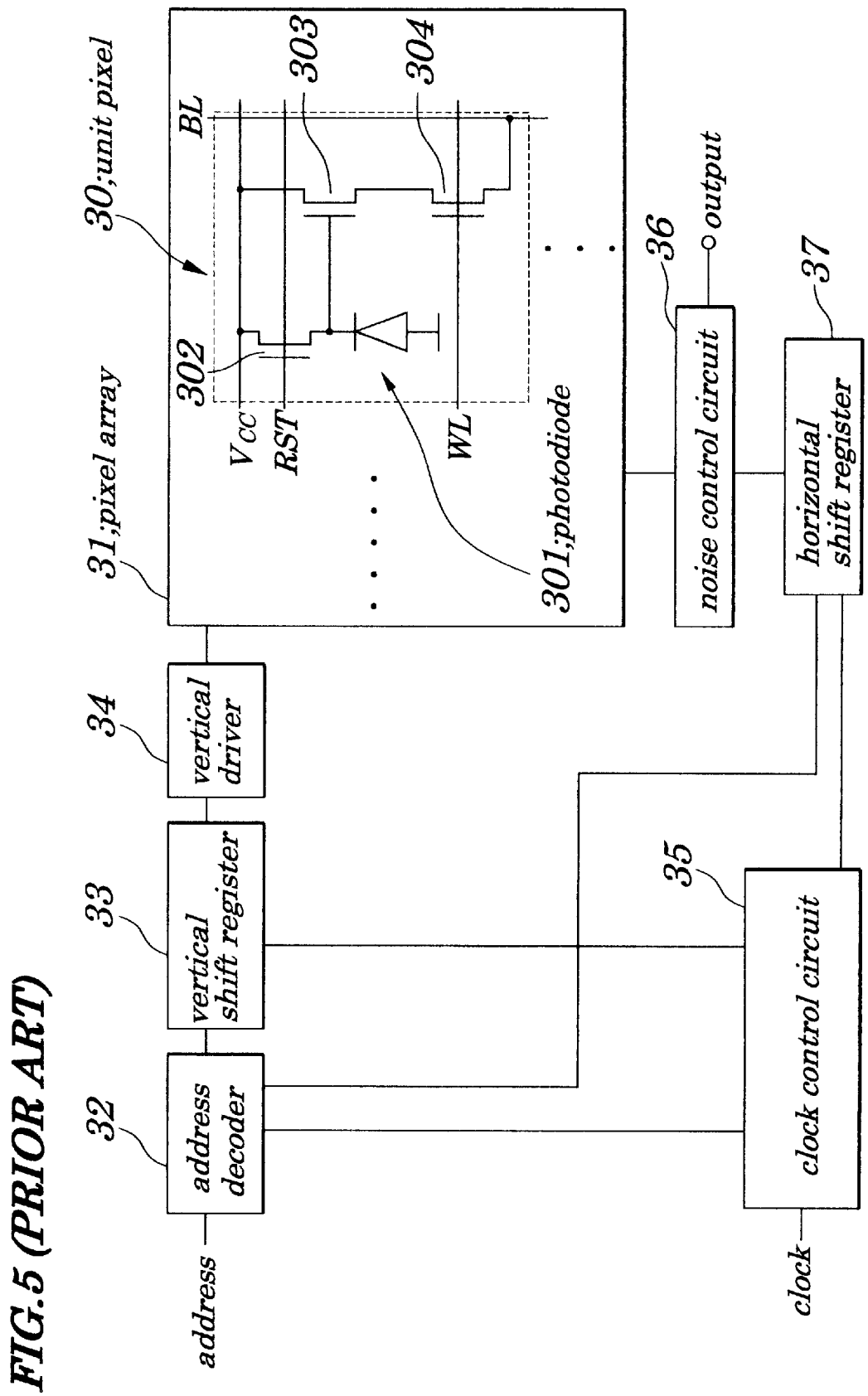
FIG. 5 is a block diagram of a conventional MOS-type image sensor.

FIG. 3 is a block diagram showing electrical configurations of an image sensor according to a second embodiment of the present invention. FIG. 4 is a timing chart showing operations of the image sensor shown in FIG. 3.

Referring to FIG. 3, the image sensor is composed of unit pixels 21 and 22 located on an arbitrary n-th (n=0,1,2 . . . ) line and in a n-th+1st string being neighboring to an arbitrary n-th string in a pixel array constituting the image sensor, noise control circuits 23 and 24 on the n-th string and n-th+1st string respectively, a current source 25 constituting a source follower together with transistors 203 of the noise control circuit 23 and the like, a P channel transistor 28 constituting a gate. The number of lines and strings constituting the pixel array is configured arbitrarily.

The pixel 21 consists of a photodiode 101 being a photoelectric converter, N channel transistors 102, 103, 104 and 106, and a current source 105. Configurations and functions other than the transistor 106 are the same as those of a pixel 41 shown in FIG. 6.

The transistor 106 connects an anode of a photodiode 101 to transistors 102 and 103 in accordance with a photodiode connecting control signal TGn. Configurations and functions of a pixel 22 and of other pixels not shown are the same as those of the pixel 21.

A noise control circuit 23 is composed of N channel transistors 201, 203, 204 and 206, and a coupling capacitor 202. Configurations and functions of parts consisting of transistors 201, 203 and 204, and the coupling capacitor 202 are the same as those of a noise control circuit 43 shown in FIG. 6, however, the noise control circuit 23 has no transistor 205 that a noise control circuit 43 has.

The transistor 206 clamps a voltage of the node S/Hn on a sum of a voltage V1 of a power supply OCVn and a threshold voltage Vt of the transistor 203. Configurations and functions of the noise control circuit 24 and other noise control circuits not shown are the same as those of the noise control circuit 23.

Configurations and functions of current sources 25 and 27, and transistors 26 and 28 are the same as those of current sources 45 and 47, and transistors 46 and 48.

Operations of the image sensor according to the second embodiment are described hereafter by referring to FIG. 4.

By making LOW a vertical read-out control signal, a vertical address of a pixel array is sequentially designated. In this state, by making LOW a photodiode connecting control signal TGn, a gate composed of the transistor 106 is turned OFF, causing the photodiode 101 to be isolated from the pixel. When a word read-out signal WLn goes HIGH in accordance with the designated vertical address, a gate composed of the transistor 104 is turned ON, causing the transistor 103 and the current source 105 to be connected. Moreover, by making HIGH a reset control signal RSTn, a gate composed of the transistor 102 is turned ON, causing a gate of the transistor 103 to be charged to a power supply voltage Vcc. At the same time, by making HIGH a signal voltage read-out control signal SHS and a threshold read-out control signal OCS, a gate composed of the transistor 201 is turned ON by the signal SHS, causing a data output line DATAn used to transmit an output from a source follower consisting of the transistor 103 and the current source 105 to be connected to the coupling capacitor 202 and then causing a voltage being equivalent to a photoelectric conversion voltage generated when the photodiode 101 is unexposed to light to be read out from the coupling capacitor 202, while simultaneously a gate composed of the transistor 206 is turned ON by the OCS signal, causing the voltage of the power supply OCVn to be dropped to a definite voltage V1 and, as a result, the voltage of the node S/H on the output side of the coupling capacity 202 is clamped on V1 +Vt (Vt being a threshold voltage of the transistor 203).

Then, by making LOW the threshold read-out signal OCS, a gate consisting of the transistor 209 is turned OFF and the voltage of the power supply OCVn is restored to the power supply voltage Vcc, and further by making LOW the signal voltage read-out control signal SHS, a gate composed of the transistor is turned OFF, causing the data output line DATAn to be isolated from the coupling capacitor 202. Furthermore, by making LOW the reset control signal RSTn, a gate composed of the transistor 102 is turned OFF, causing a gate of the transistor 103 to be isolated from the power supply with a voltage Vcc.

Then, by making HIGH a photodiode connecting control signal TGn, a gate composed of the transistor 106 is turned ON, causing a node of the photodiode 101 to be connected to a gate of the transistor 103, and by making HIGH the signal voltage read-out control signal SHS, a gate composed of the transistor 201 is turned ON, causing the data output line DATAn to be connected to the coupling capacitor 202, and if a photodiode conversion voltage of the photodiode 101 is applied to the coupling capacitor 202 through the data output line DATAn, a voltage represented by the following formula (3) is read out by the node S/Hn through the coupling capacitor 202:

$$V1 + Vt + \text{(photoelectric voltage generated at unexposed time)} - \text{(photoelectric voltage generated at exposed time)} \quad (3)$$

At this point, when a bit line read-out control signal SWn is made HIGH, a gate composed of the transistor 204 is turned ON and a voltage of the node S/Hn is outputted at a gate through a source follower composed of the transistor 203 and the current source 26. In this state, when an output enable signal OE goes LOW, a gate composed of the transistor 28 is turned ON and an output voltage Vout is generated through a follower composed of the transistor 26 and the current source 27.

Because the output voltage Vout corresponds with the remainder of the photoelectric voltage generated at the unexposed time and that generated at the exposed time as shown in the above formula (3), in the external circuits now shown, by this output voltage Vout, signal voltages from which a noise caused by switching operation of each transistor constituting gates of the pixel 21 and the noise control circuit 23 has been removed or in which the dispersion in threshold values of the transistor 103 constituting the source follower of the pixel 21 has been offset and removed can be obtained, and further because, to the voltage of the node S/Hn, a threshold voltage Vt of the transistor 203 constituting a source follower for outputting signals for every column is added, the dispersion in the threshold values of this transistor is offset and removed, changes in operational characteristics can be compensated accordingly.

In the image sensor according to this embodiment, output voltages in which threshold voltages of the transistor constituting a source follower for outputting signals for every column have been offset can thus be obtained, thereby allowing supply of signal voltages of a pixel in which changes in operational characteristics caused by the dispersion in the threshold voltages have been compensated.

It is apparent that the present invention is not limited to the above embodiments but may be changed and modified without departing from the scope and spirit of the invention. For example, in the above each embodiment, the number of lines and strings of unit pixel constituting a matrix-like pixel array can be configured arbitrarily. Moreover, the N and P channel transistors can be arbitrarily replaced each other depending on circuit design and configurations of the power supply.

Thus, according to the image sensor of the present invention, photoelectric conversion voltages generated when a pixel is unexposed and exposed to light are read out through a coupling capacitor and are outputted through a follower and, a signal output with its noise removed by the remainder of the photoelectric conversion voltage generated at the unexposed time and that generated at the exposed time is obtained, and further since an output voltage of the pixel generated at the unexposed or exposed time is read out through a coupling capacitor while a voltage of the node on the output side of the coupling capacitor for every column is clamped on a sum of a definite voltage and a threshold voltage of the transistor constituting a source follower, a signal output in which threshold voltage of a transistor constituting a source follower is offset, thus allowing the implementation of the image sensor with operational characteristics caused by the dispersion in the threshold values compensated.

Moreover, in the image sensor wherein, by sequentially applying photoelectric conversion voltages generated when the pixel is exposed to light and when the pixel is unexposed to light to the coupling capacitor, an output, generated at the node on the output side of the coupling capacitor, being the remainder of the photoelectric conversion voltage generated when the pixel is unexposed to light and that generated when exposed to light is taken through the source follower, since the voltage of said node of the output side of said coupling capacitor is clamped on a sum of a definite voltage and a threshold voltage of a transistor constituting said source follower and, after the photoelectric conversion voltage generated when said pixel is exposed to light has been read out, the photoelectric conversion voltage when said pixel is unexposed to light is read out, an output voltage in which the threshold voltage of the transistor constituting the source follower is offset and removed can be obtained, and accordingly an output of the image sensor is not affected by the dispersion in threshold voltages of the transistor constituting the source follower used to output a signal voltage of each column to the outside.

Furthermore, in the image sensor wherein, by sequentially applying photoelectric conversion voltages generated when the pixel is exposed to light and when the pixel is unexposed to light to the coupling capacitor, an output, generated at the node on the output side of the coupling capacitor, being the remainder of the photoelectric conversion voltage generated when the pixel is unexposed to light and that generated when exposed to light is taken through the source follower, since the voltage of said node of the output side of the coupling capacitor is clamped on a sum of a definite voltage and a threshold voltage of the transistor constituting said source follower and after the photoelectric conversion voltage generated when said pixel is unexposed to light has been read out, the photoelectric conversion voltage generated when the pixel is exposed to light is read out, an output in which a threshold voltage of the transistor constituting the source follower is offset and removed can be obtained and, accordingly, an output of the image sensor is not affected by a dispersion in threshold voltages of the transistor constituting the source follower used to output a signal voltage of each column to the outside.

Finally, the present application claims the priority of Japanese Patent Application No. Hei10-214230 filed on Jul. 29, 1998, which is herein incorporated by reference.

What is claimed is:

1. An image sensor comprising:

a coupling capacitor to which a photoelectric conversion voltage generated when a pixel is exposed to light and a photoelectric conversion voltage generated when said pixel is unexposed to light are sequentially applied; and a source follower through which an output, generated at a node on the output side of said coupling capacitor, being the remainder of said photoelectric conversion voltage generated when said pixel is unexposed to light and that generated when said pixel is exposed to light is taken;

whereby said node on the output side of said capacitor is clamped on a sum of a definite voltage and a threshold voltage of a transistor constituting said source follower and, after said photoelectric conversion voltage generated when said pixel is exposed to light has been read out, said photoelectric conversion voltage generated when said pixel is unexposed to light is read out.

2. The image sensor according to claim 1 wherein said pixel is provided with a photodiode with its cathode grounded and with its anode reset to a predetermined voltage at the time of a start of operations, and with a source follower used to output a voltage of said anode of said photodiode to said data output line when data is read out.

3. An image sensor comprising:

a coupling capacitor to which a photoelectric conversion voltage generated when a pixel is exposed to light and a photoelectric conversion voltage generated when said pixel is unexposed to light are sequentially applied; and a source follower through which an output, generated at a node on the output side of said coupling capacitor, being the remainder of said photoelectric conversion voltage generated when said pixel is unexposed to light and that generated when said pixel is exposed to light is taken;

whereby a drain of a transistor constituting said source follower, when said photoelectric conversion voltage generated when said pixel is exposed to light is read out, is clamped on a definite voltage, and a gate and a source of said transistor is connected via gate means and, when said photoelectric conversion voltage generated when said pixel is unexposed to light is read out, said gate means is turned off and simultaneously said clamping of said drain is released.

4. The image sensor according to claim 3 wherein said pixel is provided with a photodiode with its cathode grounded and with its anode reset to a predetermined voltage at the time of a start of operations, and with a source follower used to output a voltage of said anode of said photodiode to said data output line when data is read out.

5. An image sensor comprising:

a coupling capacitor connected to a data output line for every column through a first gate means which is turned on when a signal voltage of said data output line is read out; and a source follower used to read out a voltage at a node on the output side of said coupling capacitor;

whereby a second gate connected between a drain of a transistor constituting said source follower and said node is turned on, causing said node to be pre-charged to a power supply voltage and then a third gate means connected between a gate of said transistor and a source is turned on and, with a voltage of a drain of said transistor dropped to a definite level, said first gate means is turned on, causing an output voltage of said data output line generated when said pixel is exposed to light to be applied to said coupling capacitor and, then, with the voltage of a drain of said transistor restored to a power supply voltage, said first gate means is again turned on, causing an output voltage of said data output line generated when said pixel is unexposed to light to be applied to said coupling capacitor.

6. The image sensor according to claim 5 wherein said pixel is provided with a photodiode with its cathode grounded and with its anode reset to a predetermined voltage at the time of a start of operations, and with a source follower used to output a voltage of said anode of said photodiode to said data output line when data is read out.

7. An image sensor comprising:

a coupling capacitor to which a photoelectric conversion voltage generated when a pixel is exposed to light and that generated when said pixel is unexposed to light are sequentially applied; and a source follower through which an output, generated at a node on the output side of said coupling capacitor, being the remainder of said photoelectric conversion voltage generated when said pixel is unexposed to light and that generated when said pixel is exposed to light is taken;

whereby a node on the output side of said coupling capacitor is clamped on a sum of a definite voltage and a threshold voltage of the transistor constituting said source follower and, after the photoelectric conversion voltage generated when said pixel is unexposed to light has been read out, the photoelectric conversion voltage generated when said pixel is exposed to light is read out.

8. The image sensor according to claim 7 wherein said pixel is provided with a photodiode with its cathode grounded and with its anode reset to a definite voltage at the time of a start of operations, a source follower used to output the voltage of said anode of said photodiode to said data output line when data is read out and a fourth gate means used to isolate said photodiode from said pixel.

9. An image sensor comprising:

a coupling capacitor to which a photoelectric conversion voltage generated when a pixel is exposed to light and that generated when said pixel is unexposed to light are sequentially applied; and a source follower through which an output, generated at a node on the output side of said coupling capacitor, being the remainder of said photoelectric conversion voltage generated when said pixel is unexposed to light and that generated when said pixel is exposed to light is taken;

whereby, at the time when the photoelectric conversion voltage generated when said pixel is unexposed to light is read out, with a photodiode isolated from said pixel, the voltage of a drain of the transistor constituting said source follower is dropped to a definite level and, at the same time, a gate and a source of said transistor are connected via a gate means, and at the time when the photoelectric conversion voltage generated when said pixel is exposed to light is read out, the photodiode is connected to said pixel and said gate means is turned off and simultaneously the voltage of said drain is restored to its original level.

10. The image sensor according to claim 9 wherein said pixel is provided with a photodiode with its cathode grounded and with its anode reset to a definite voltage at the time of a start of operations, a source follower used to output the voltage of said anode of said photodiode to said data output line when data is read out and a fourth gate means used to isolate said photodiode from said pixel.

11. An image sensor comprising:

a coupling capacitor connected to a data output line for every column through a first gate means which is turned on when a signal voltage of said data output line is read out; and a source follower used to read out a voltage at a node on the output side of said coupling capacitor;

whereby, with a photodiode isolated from a pixel, a second gate between a gate and a source of a transistor constituting said source follower and, at the same time, with a drain of said transistor dropped to a definite voltage, said first gate means is turned on, causing an output voltage of a data output line in said pixel to be applied to said coupling capacitor, and then said photodiode is connected to said pixel and, with the voltage of the drain of said transistor restored to a power supply voltage, said first gate means is turned on, causing an output voltage in said data output line generated when said pixel is exposed to light to be applied to said coupling capacitor.

12. The image sensor according to claim 11 wherein said pixel is provided with a photodiode with its cathode grounded and with its anode reset to a definite voltage at the time of a start of operations, a source follower used to output the voltage of said anode of said photodiode to said data output line when data is read out and a fourth gate means used to isolate said photodiode from said pixel.

* * * * *